June 6, 1967 J. PEARL 3,324,403

MULTIPLE SUPERCONDUCTIVE ELEMENT PARAMETRIC AMPLIFIERS AND SWITCHES

Filed March 8, 1965

INVENTOR.
JUDEA PEARL
BY
Edward J. Norton
Attorney

United States Patent Office 3,324,403

Patented June 6, 1967

3,324,403

MULTIPLE SUPERCONDUCTIVE ELEMENT PARAMETRIC AMPLIFIERS AND SWITCHES

Judea Pearl, New Brunswick, N.J., assignor to Radio Corporation of America, a corporation of Delaware Filed Mar. 8, 1965, Ser. No. 437,927
4 Claims. (Cl. 330—4.5)

This invention relates to superconductive structures and more particularly to the application of improved superconductive structures in amplifiers, switches, and other signal control devices.

It has long been known that superconductors exhibit low resistivity and the ability to withstand the effect of an applied magnetic field if that field is held below a critical value and the ambient temperature approaches absolute zero (0° Kelvin). Instead of abruptly ending at the surface of superconductors, an applied magnetic field penetrates a distance λ (lambda) called the penetration depth. λ may be varied over a range of values by changing either the strength of the applied magnetic field or the ambient temperature. This property of superconductors has been used in efforts to construct amplifiers, switches, and other devices with varying degrees of success.

Superconductors present an amount of inductance, due to the magnetic field penetration, which is proportional to the volume occupied by the magnetic field. This volume is equal to the product of λ and the total superconductor surface area. Where λ may be varied by a fixed amount, the greater the surface area of the superconductors, the greater the inductance can be varied. Efforts have been made to make use of this variable inductance in various devices including amplifiers, and particularly parametric amplifiers.

In one approach, a parametric amplifier has been arranged in the cavity mode of operation with a superconductor mounted within a resonant cavity. The change of inductance of the superconductor is small when compared with the over-all cavity inductance. Because of this, waveguides and cavities of extremely high Q's must be used to accomplish efficient coupling and amplification. A high Q device has a narrow frequency band of amplification and requires greater care in the construction of the amplifier. In a further approach, the superconductors, in order to provide large surface areas, have been arranged in the manner of closely spaced transmission line conductors. Because such a structure exhibits a low impedance to applied signal energy, it has proven difficult to couple effectively sources of signal or pump energy to such structures.

When superconductors are employed in a switch, it is not possible to propagate a microwave signal through the superconductive structure. Rather, the relative resistivity between the high conductive and low conductive states of superconductors is used to control a signal-carrying current. The speed or rate of generation of superconductor switches are limited by the time required to switch the superconductor between the high and low conductive states. This time is dependent upon electromagnetic diffusivity. The electromagnetic diffusivity, in turn, is the result of eddy currents which tend to screen the magnetic field from portions of the superconductor still in a superconductive or high conductive state.

It is an object of this invention to increase the variation of inductance obtainable in the operation of a superconductive structure.

Another object is to provide a parametric amplifier of the resonant cavity mode of operation employing a superconductive structure having a higher gain than has been heretofore possible.

Another object is to provide a parametric amplifier of the traveling wave mode of operation employing a superconductive structure having a wide frequency band and exhibiting a higher matching impedance than has been heretofore possible.

Another object is to provide an improved superconductive structure capable of switching microwave signals.

Another object is to provide a superconductive structure capable of permitting a microwave signal to propagate therethrough.

Another object is to provide a superconductive structure capable of controllably attenuating a microwave signal.

Still another object of the invention is to provide a superconductor switch capable of switching a signal at a high rate.

In accordance with the present invention, an improved superconductive structure is provided which comprises a multitude of superconducting members in combination with a dielectric which insulates the superconducting members from one another. The total volume of the superconducting members which can be penetrated by an applied magnetic field is comparable to the volume of the combined dielectric and superconducting members.

In one embodiment of this invention, a plurality of sheets constructed of superconducting material are separated by sheets of dielectric. The inductance of such a combination when constructed as a single, unified structure is proportional to the total volume of the structure. However, the variable inductance is proportional to the amount of surface area of the superconductors. Therefore, in combining a plurality of thin superconductor sheets, a large variation in relative inductance is achieved. Because the gain of a parametric amplifier is approximately equal to the relative change of inductance within the active member (e.g. a resonant cavity), the greater the surface area of the superconductors within the active member the higher the gain.

In another embodiment the superconductive structure is in the form of fine superconductor particles mixed with dielectric. This structure can be employed as an active member of a parametric amplifier in the same manner as the structure employing sheets of superconductors and dielectric. In addition, the embodiment of superconductor particles and dielectric placed in the path of a microwave signal will serve as an attenuator or switch. When the superconductors are in a superconductive or high conductivity state, a microwave signal can be propagated therethrough with little attenuation. When the superconductors are in a high resistive or low conductive state, the eddy current losses tend to "switch off" or dissipate the signal. Between these two states the strength of the applied signal can be controlled or modulated.

The novel features of the present invention, both as to its method and organization as well as additional objects and advantages thereof, will be understood more fully from the following detailed description when read in connection with the accompanying drawings in which similar reference marks designate similar parts throughout, and in which.

Figures 1, 2, 3, 4, 5:
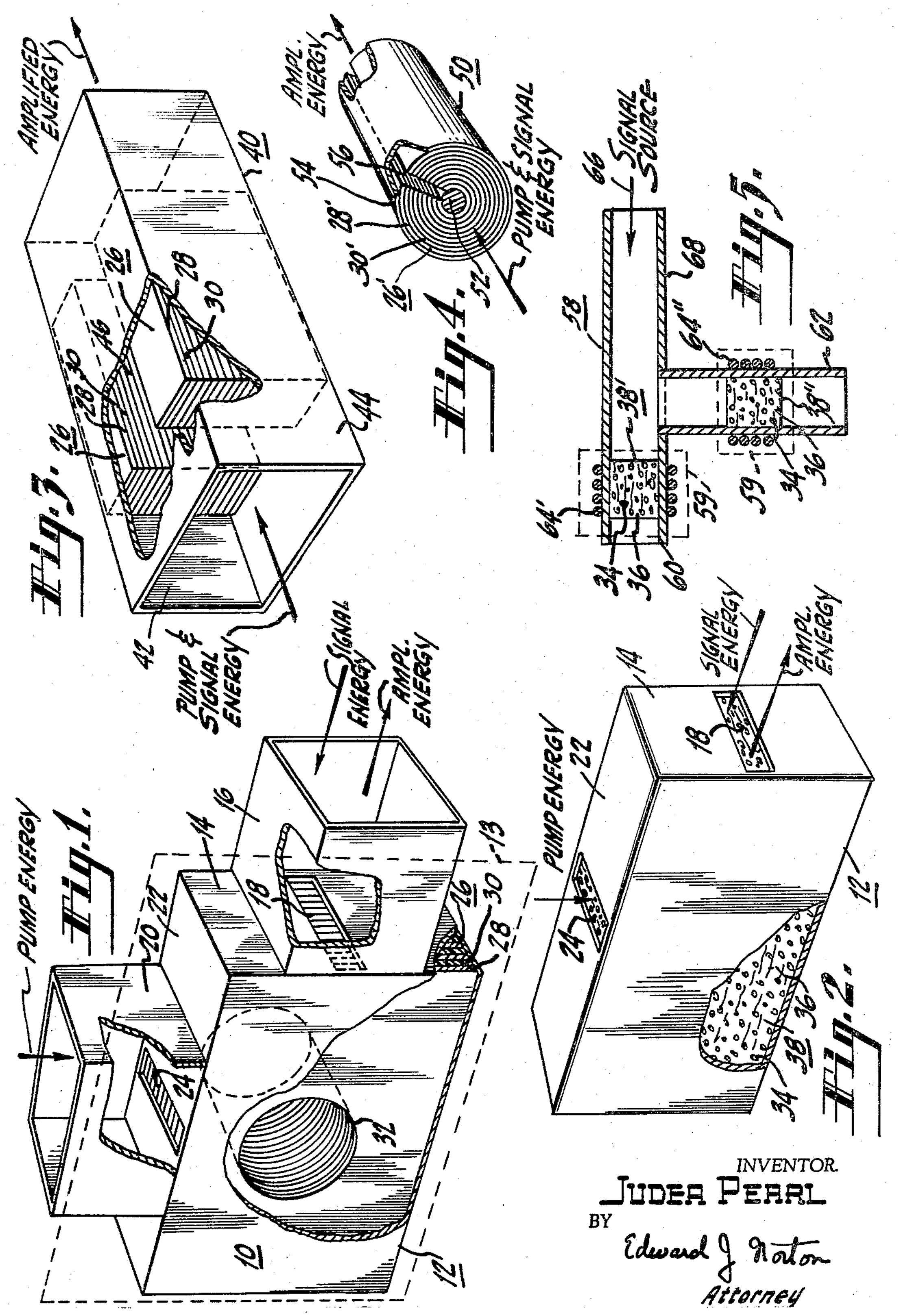
FIG. 1 is a partially sectioned, perspective view of a parametric amplifier constructed in accordance with the invention.
FIG. 2 is a partially sectioned, perspective view of a resonant cavity constructed in accordance with the invention.
FIG. 3 is a partially sectioned, perspective view of a waveguide structure constructed in accordance with the invention.
FIG. 4 is a perspective view of a transmission line structure constructed in accordance with the invention.
FIG. 5 is a schematic view of a switch constructed in accordance with the invention.

Turning now to the drawing, a parametric amplifier 10 is shown in FIG. 1 which embodies one form of the invention. The amplifier 10 which operates on principles common to parametric amplifiers, comprises a rectangular resonant cavity 12 (shown partially sectioned) with walls constructed of a conductor such as silver or of a superconductor such as lead. To a first wall 14 of the cavity 12 is affixed a waveguide 16 (shown partially sectioned). The waveguide 16 which can be of a normal conductive or superconductive material surrounds a first narrow rectangular slot 18 in the first wall 14 of the cavity 12.

A second waveguide 20 (shown partially sectioned) which can also be of a conductive or superconductive metal is affixed to a second wall 22 of the cavity 12 and surrounds a second narrow rectangular slot 24 in the second wall 22 of the cavity 12. The second wall 22 is perpendicular to the first wall 14. A superconductive structure 26 is mounted within the cavity 12. The superconductive structure 26 comprises thin superconductor sheets 28 which can be constructed of any superconductive material, such as tin. The sheets 28 are separated by layers of dielectric material 30, such as silicon monoxide or a polyethylene terephthalate resin.

The superconductive structure 26 can be made by stacking together dielectric sheets made of a flexible substrate, such as polyethylene terephthalate resin, metalized by a suitable superconductive metal such as tin. Another way of making the superconductive structure 26 is by evaporative deposition in a known manner of alternate layers of a superconductive metal, such as tin, with layers of a dielectric, such as silicon monoxide.

The superconductice structure 26 is placed in the cavity 12 with the layers of superconductor sheets 28 and the dielectric sheets 30 lying in a plane perpendicular with the first and second walls 14 and 22. The superconductor sheets 28 are kept at the proper controlled temperature by immersing the cavity 12 in a liquified gas, such as helium (not shown), or by any other suitable means, as indicated by the dotted lines 13 enclosing the cavity 12. Parametric amplifiers amplify by varying a reactance from a source of pump energy at a proper frequency. This varying reactance interacts with a signal energy to produce an amplified signal. In superconductor parametric amplifiers, the parametric varaition is provided by the process of altering the penetration depth (λ) of a magnetic field into a superconductor and thereby changing the inductance.

In FIG. 1 a first source of energy (not shown) provides signal energy to the first waveguide 16. The first waveguide 16 channels the signal energy through the first slot 18 into the cavity 12. A second source of energy (not shown) supplies pump energy to the second waveguide 20. The second waveguide 20 guides the pump energy through the second slot 24 into the cavity 12. The pump and signal energies interact across the superconductive structure 26 within the cavity 12 to produce an amplified signal energy. The amplified signal energy leaves the cavity 12 through the first slot 18 and the first waveguide 16. The usual circulators, gyrators or other structure, not shown, can be provided in the conventional manner to guide signal energy to and the amplified signal energy from the cavity 12 via the waveguide 16.

The arrangement of the superconductive structure 26 and the construction of the first and second waveguides 16 and 20 will operate most efficiently with the pump and signal energies in the TE mode. In this mode the magnetic field components are tangential to the superconductor sheets 28. This provides for the most efficient use of the energies supplied since it is only the tangential component of the magnetic field which penetrates a superconductor.

Efficient use of the signal energy requires that there be minimum dissipation of its electric field by the dielectric sheets 30. Since the electric and magnetic components of the signal energy are perpendicular to one another, it is possible to place the superconductive structure 26 in that volume of the cavity 12 which is occupied by the greatest magnetic field component and weakest electric field component.

If the parametric amplifier of FIG. 1 is operated in a particular mode with known pump and signal energies, the size of the cavity 12 and the form of the superconductive structure 26 can be determined. For example, the amplifier can be operated in the degenerative mode with the frequency of the pump energy twice the frequency of the signal energy. Assuming the pump energy is in the $TE_{310}$ mode at 4 kmc. and the signal energy is in the $TE_{110}$ mode at 2 kmc., the lengths, i.e. long dimension, of the first and second wall 14 and 22 of the cavity 12 will be approximately 4.08 cm. and 3.16 cm., respectively. The slots 18 and 24 are dimensioned so as to admit energies of the desired frequencies. The depth of the cavity 12 will be determined by the desired cavity impedance, cavity Q, and inductance variation of the superconductive structure 26.

The cavity impedance, cavity Q, and the amount of variation of inductance possible in the superconductive structure 26 is determined by the thickness and surface area of the superconductor and dielectric sheets 28 and 30. The surface area of the sheets are limited by the dimensions of the active member in which they are placed. By using many superconductor sheets 28, which are each preferably less than two times λ, or about 5,000 A., and dielectric sheets 30, which can be of the order of 1,000 A., high variations of inductance can be achieved with impedances of about 50 ohms (a value of impedance commonly used) and Q's of a practical value (e.g. from 200 to 1000).

The signal energy $TE_{110}$ mode determines the distribution of the electric and magnetic fields within the cavity 12. The superconductive structure 26 is placed within the cavity 12 so as to take the best advantage of the magnetic components and to dissipate little electric energy. This arrangement is shown in FIG. 1 as a cylindrical hole 32 centrally located in the superconductive structure 26. The axis of the cylindrical hole 32 lies parallel to the first and second walls 14 and 22 of the cavity 12. In this volume 32 the electric field component of the $TE_{110}$ signal is propagated. The shape of the volume 32 removed from the superconductive structure 26 conforms to the distribution of the $TE_{110}$ electric field and can be arranged differently for other modes of signal energy.

In FIG. 2 a cavity 12, of the type in FIG. 1, is shown. A multiplicity of superconductor particles 34, which can be any suitable superconductive metal such as tin, is mixed with a dielectric 36, which can be petroleum jelly or a plastic forming a superconductive structure 38. The dielectric 36 insulates the superconductor particles 34 from one another. This structure 38 occupies a volume of the cavity 12 comparable to that of the superconductive structure as discussed in FIG. 1. Pump energy is applied as in the embodiment of FIG. 1 to the cavity 12 via the slot 24. Signal energy is fed to and the amplified signal energy is recovered from the cavity 12 via the slot 18.

The combination of superconductive sheets and dielectric sheets 28 and 30 (in FIG. 1) or superconductor particles 34 and dielectric 36 (in FIG. 2) may be used in any of the other forms of parametric amplifiers such as those employing waveguides or transmission lines.

In FIG. 3 a waveguide 40, which may be of any normal or superconductive metal, is typical of the type used in parametric amplifiers wherein the inventive superconductive structure 26 of superconductor sheets 28 and dielectric sheets 30 is placed. In a similar manner the superconductive structure 38 of superconductor particles 34 and dielectric 36 (shown in FIG. 2) may be substituted for the aforementioned sheets.

Signal and pump energies conform to the TE mode within the waveguide 40. The magnetic components of those energies can, for instance, be made to propagate perpendicularly to a parallel first and second walls 42 and 44. The magnetic field intensity is strongest at each of the two walls 42 and 44 and falls away sharply thereafter. The electric components of the energy propagates tangentially to the two walls 42 and 44. The electric field intensity is strongest at a point between the two walls 42 and 44.

The superconductive structure 26 is placed within the waveguide 40 so as to take advantage of the distribution of the magnetic field components and avoid unnecessary dissipation of signal electric field energy. The structure 26 is placed along the two walls 42 and 44 with the sheets 28 and 30 lying on a plane tangential to the propagated magnetic components. A passageway 46 is left in the region where the electric field is strongest.

In a parametric amplifier employing a transmission line, the inventive combination of dielectric sheets separating superconductor sheets or the combination of superconductor particles and dielectric can be employed. FIG. 4 shows sheets of superconductors and dielectric 28' and 30' in a transmission line 50 having inner and outer conductors 52 and 54 of any normal or superconductor. The sheets 28' and 30' conform to the shape of the transmission line 50 and are located between the outer conductor 54 and the inner conductor 52 so as to be tangential to the magnetic field component of a TEM wave (not shown) which can be propagated therethrough.

The combination of superconductor sheets 28' and 30' can be formed by metallizing a continuous sheet of flexible substrate. (The metal can be of tin and the flexible substrate can be of polyethylene terephthalate resin.) The continuous sheet is then wrapped around the inner conductor 52. A slot 56 is cut radially through the superconductor structure 26' of the superconductor sheets 28' and dielectric sheets 30' and axially along the entire length of the transmission line 50. The slot 56 transforms the superconductive structure 26' into the separate concentric layers of dielectric sheets 30' and superconductor sheets 28'. Thereafter, the outer conductor 54 is placed about the superconductive structure 26' forming the transmission line 50. Another method of forming the superconductive structure 26' is by evaporative deposition of a superconductive metal such as tin on a continuous sheet of polyethylene terephthalate resin. Each deposit of metal should be isolated from other similar deposits forming discontinuous regions. In this manner the necessity of a slot 56 is removed. In wrapping the polyethylene terephthalate resin sheets about the inner conductor 52, a continuous wrapping of superconductors cannot result.

The large number of superconductor sheets 28' allow a characteristic impedance of 50 ohms (a commonly used value). Thus, the transmission line 50 may be efficiently coupled to transmission paths for use as a parametric amplifier.

The importance of the increased surface area provided by the superconductive structure shown in FIG. 1 (26), FIG. 2 (38) and FIG. 4 (26') may be shown from the following relationships:

$$\frac{\Delta L}{L} \cong \frac{1}{Q}$$

Where, ΔL is the change of inductance within an active member of a parametric amplifier; L is the inductance of the active member of a parametric amplifier.

In FIG. 1, for example, L would be the inductance of the resonant cavity 12; and ΔL would be the variation of inductance achieved by a magnetic field influencing the superconductive structure 26.

$$\Delta L \alpha S \cdot \Delta\lambda$$

Where, S is the total surface area of the superconductors; and Δλ is the change of penetration depth of a magnetic field.

In FIG. 1, as in other parametric amplifiers of this type, the inductance is approximately proportional to the volume of the cavity (or active member).

$$L \alpha V$$

Where, V is the volume of the active member. In FIG. 1, V represents the volume of the cavity 12.

Substituting the above values for ΔL and L, we have $$\frac{S \cdot \Delta\lambda}{V} \cong \frac{1}{Q}$$

In addition, a relationship may be expressed $$\frac{\Delta\lambda}{\lambda} = \alpha$$

Where, α is the percent change of penetration.

Multiplying Δλ in the relationship $$\frac{S \cdot \Delta\lambda}{V} \text{ by } \frac{\lambda}{\lambda}$$

the relationship that $$\frac{1}{Q} \cong \frac{S \cdot \lambda\alpha}{V}$$

is established, which states that in order for amplification to occur, the ratio of the product of the total surface area S, penetration depth λ, and the percentage change in penetration depth α with respect to the volume V of the active member must be approximately equal to the inverse of the quality factor Q. From this relationship it can be seen that by enlarging the total surface area S of the superconductors with respect to the volume V of the member within which the superconductive structure resides, there will result an increase in the gain of a parametric amplifier.

The superconductive structures described herein efficiently permit the propagation of microwave energy therethrough. This phenomenon makes it possible to employ the superconductive structure as an attenuator or a switch. The combination of superconductive particles 34 and dielectric 36 in a superconductive structure 38 as shown in FIG. 2, is employed in a switch 58, shown in FIG. 5. A first superconductive structure 38' is placed in a first branch 60 of the T-shaped waveguide switch 58. The superconductive structures 38' and 38'' are maintained below the critical temperature by means of immersion in a liquified gas such as helium (shown in dotted lines 59). Coils 64' and 64'' are placed about the first and second branches 60 and 62, respectively, of the waveguide switch 58. The coils 64' and 64'' when activated provide the magnetic field necessary to control the superconductivity of the superconductive structures 38' and 38'', respectively.

A signal source 66 introduces a signal into the third branch 68 of the waveguide switch 58. If the first coil 64' about the first branch 60 maintains a magnetic field above the critical value, the signal entering the first branch 60 is attenuated or "switched off." The attenuation occurs because the superconductive particles 34 within the first superconductive structure 38' are in a normal conductive state and, therefore, highly lossy. If the second coil 64'' about the second branch 62 maintains a magnetic field below the critical value, the superconductive particles 34 will be in a superconductive state, and the signal will propagate therethrough with little attenuation. A switch is effected by raising the magnetic field about the second branch 62 to above the critical value and lowering the field about the first branch 60 below the critical value. By varying the magnetic field in a range about the critical value, various degrees of attenuation of the signal may be achieved. Because of the very small volume of each superconducting particle, the time necessary for switching between superconducting and conducting states is very short, Therefore, the waveguide switch 58, in FIG. 5, can operate at a higher speed than other switches employing superconductors of macroscopic dimensions.

I claim:

1. A superconducting parametric amplifier comprising:

(a) a composite superconductor structure including a plurality of superconducting sheets each separated from another by a dielectric sheet, each superconducting sheet having an inductance which is a function of the penetration depth of an applied magnetic field, said composite structure having an aperture therethrough dimensioned to support a desired electromagnetic field, said composite structure further including a waveguide means enclosing said superconducting and dielectric sheets, (b) means to apply pump energy within said waveguide means to cause the penetration depth of said superconductor sheets to vary in accordance with the magnetic field component of said pump energy, (c) means to apply signal energy to be amplified within said waveguide means, (d) said pump and signal energy being determined and said sheets being positioned within said waveguide means to cause said desired electromagnetic field to be propagated within said waveguide means with said superconducting sheets located where the magnetic component of said field is greatest and said aperture located where the electric component of said field is the greatest, whereby said signal energy is amplified in accordance with said variation in penetration depth.

2. The superconducting parametric amplifier according to claim 1 wherein said hole is cylindrical and dimensioned to support a $TE_{110}$ mode and said pump energy is in the $TE_{310}$ mode.

3. The superconducting parametric amplifier according to claim 2 wherein said superconducting sheets are fabricated from tin and said dielectric sheets are fabricated from polyethylene terephthalate resin.

4. In a parametric amplifier, wherein the reactance of a superconductive structure placed within a member is to be varied by an applied magnetic field, the improvement comprising:

a plurality of superconducting thin sheets each having an inductance which is a function of the penetration depth of an applied magnetic field, a dielectric in the form of thin sheets placed between said superconducting sheets and insulating each superconducting sheet from the other, said superconducting sheets and said dielectric sheets in combination forming said structure, said dielectric sheets and said superconducting sheets being in combination in accordance with the formula $$\frac{1}{Q} \cong \frac{S.\gamma\alpha}{V}$$

where:

V is the approximate volume of said member,

S is the total surface area of said superconductors

Q is the quality factor of said member $\lambda$ is the penetration depth of said magnetic field into said superconducting sheets, and where $\alpha$ is the percentage change of the penetration depth.

References Cited

UNITED STATES PATENTS

| | | | |
|---|---|---|---|
| 3,162,717 | 12/1964 | Lentz | 333—99 |
| 3,214,249 | 10/1965 | Bean et al. | 333—99 |
| 3,265,988 | 8/1966 | Dayem et al. | 330—4 |

OTHER REFERENCES

Stierhoff: "IBM Technical Disclosure Bulletin," April 1961, p. 49.

Giedd et al.: "IBM Technical Disclosure Bulletin," April 1962, p. 63.

ROY LAKE, *Primary Examiner.*

R. R. HOSTETTER, *Assistant Examiner.*